(12) United States Patent
Lim et al.

(10) Patent No.: US 11,662,236 B2
(45) Date of Patent: *May 30, 2023

(54) SENSOR PACKAGE WITH INGRESS PROTECTION

(71) Applicant: Knowles Electronics, LLC, Itasca, IL (US)

(72) Inventors: Tony K. Lim, Naperville, IL (US); Norman Dennis Talag, Itasca, IL (US)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 465 days.

This patent is subject to a terminal disclaimer.

(21) Appl. No.: 16/813,629

(22) Filed: Mar. 9, 2020

(65) Prior Publication Data

US 2020/0209024 A1    Jul. 2, 2020

Related U.S. Application Data

(63) Continuation of application No. 16/190,059, filed on Nov. 13, 2018, now Pat. No. 10,591,326.

(Continued)

(51) Int. Cl.
*H04R 19/00* (2006.01)
*G01F 1/66* (2022.01)
(Continued)

(52) U.S. Cl.
CPC ............... *G01F 1/66* (2013.01); *B81B 7/008* (2013.01); *B81B 7/0061* (2013.01); *B81B 7/02* (2013.01);
(Continued)

(58) Field of Classification Search
CPC ......... G01F 1/66; B81B 7/0061; B81B 7/008; B81B 7/02; B81B 2201/0257; B81B 2201/0264; G01L 9/0073; G01L 19/0636; H04R 1/086; H04R 19/005; H04R 2201/003
See application file for complete search history.

(56) References Cited

U.S. PATENT DOCUMENTS

| 7,190,038 B2 | 3/2007 | Dehe et al. |
| 7,473,572 B2 | 1/2009 | Dehe et al. |
| (Continued) | | |

OTHER PUBLICATIONS

German Office Action on Appl. Ser. No. 112018005833.6 dated Jun. 3, 2022 (184 pages).

*Primary Examiner* — Matthew A Eason
(74) *Attorney, Agent, or Firm* — Foley & Lardner LLP

(57) ABSTRACT

A sensor device includes a substrate having a front surface and an opposing back surface. The back surface defines an indented region having an indented surface. The substrate defines a bottom port extending between the front surface and the indented surface. The sensor further includes a microelectromechanical systems (MEMS) transducer mounted on the front surface of the substrate over the bottom port. The sensor also includes a filtering material disposed on the indented surface and covering the bottom port. The filtering material provides resistance to ingression of solid particles or liquids into the sensor device. The filtering material is configured to provide high acoustic permittivity and have low impact on a signal-to-noise ratio of the sensor device.

18 Claims, 6 Drawing Sheets

Related U.S. Application Data

(60) Provisional application No. 62/586,115, filed on Nov. 14, 2017.

(51) Int. Cl.

| | | |
|---|---|---|
| *B81B 7/02* | (2006.01) | |
| *B81B 7/00* | (2006.01) | |
| *G01L 19/06* | (2006.01) | |
| *G01L 9/00* | (2006.01) | |
| *H04R 1/08* | (2006.01) | |

(52) U.S. Cl.
CPC ........ *G01L 9/0073* (2013.01); *G01L 19/0636* (2013.01); *B81B 2201/0257* (2013.01); *B81B 2201/0264* (2013.01); *H04R 1/086* (2013.01); *H04R 19/005* (2013.01); *H04R 2201/003* (2013.01)

(56) References Cited

U.S. PATENT DOCUMENTS

| | | | |
|---|---|---|---|
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 9,271,087 B1 | 2/2016 | Hsieh et al. | |
| 2005/0207605 A1 | 9/2005 | Dehe et al. | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2011/0255726 A1* | 10/2011 | Yu | H04R 1/025 |
| | | | 381/332 |
| 2012/0017693 A1 | 1/2012 | Robert et al. | |
| 2012/0177239 A1 | 7/2012 | Lee | |
| 2014/0037120 A1 | 2/2014 | Lim et al. | |
| 2015/0102390 A1 | 4/2015 | Liu et al. | |
| 2015/0344298 A1 | 12/2015 | Shimooka et al. | |
| 2016/0261941 A1* | 9/2016 | Brioschi | H04R 1/086 |
| 2016/0337735 A1 | 11/2016 | Lim | |
| 2017/0041692 A1* | 2/2017 | Watson | H04R 19/04 |
| 2017/0142524 A1 | 5/2017 | Sooriakumar et al. | |
| 2017/0313579 A1* | 11/2017 | Ghidoni | H04R 19/04 |

\* cited by examiner

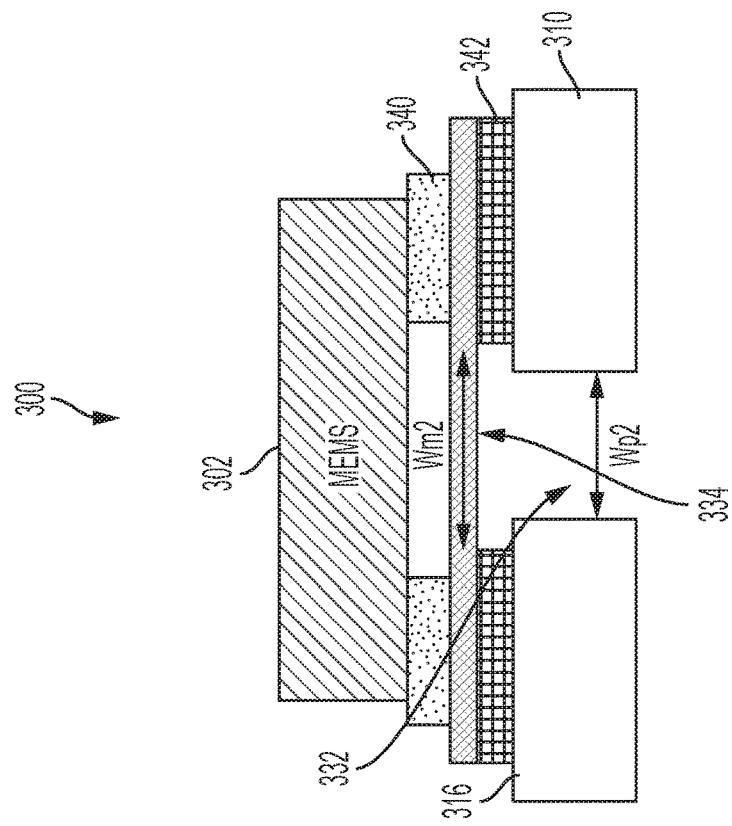
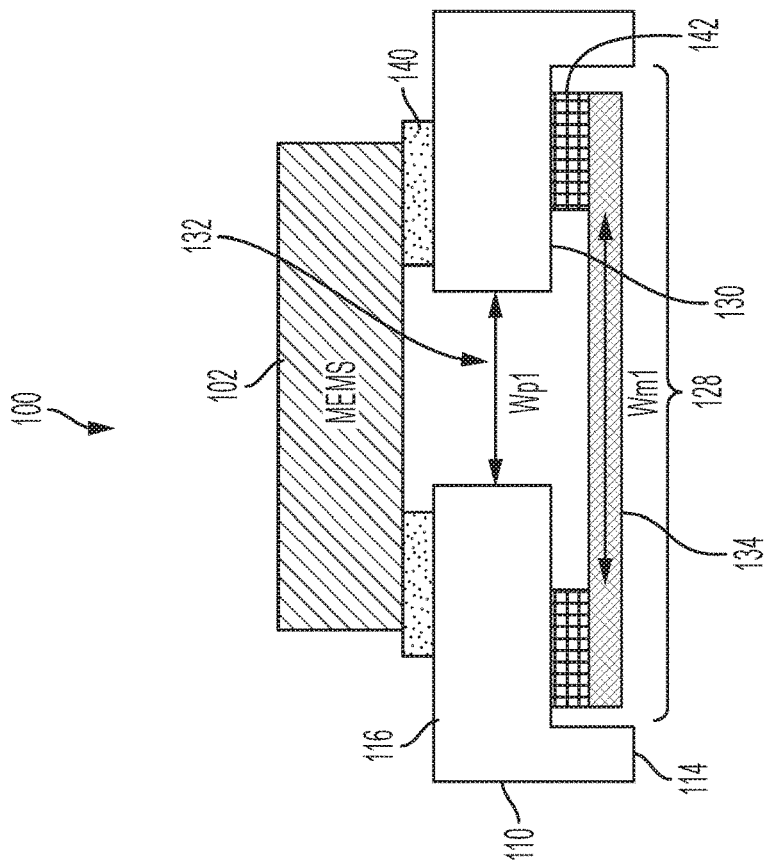

SENSOR PACKAGE WITH INGRESS PROTECTION

CROSS-REFERENCE TO RELATED APPLICATIONS

This patent application is a continuation of U.S. application Ser. No. 16/190,059, entitled "Sensor Package with Ingress Protection," filed Nov. 13, 2018, which claims priority to U.S. Provisional Application No. 62/586,115, entitled "Sensor Package with Ingress Protection," filed Nov. 14, 2017, each of which is incorporated herein by reference in its entirety.

BACKGROUND

In a microelectromechanical system (MEMS) sensor a MEMS die includes at least one diaphragm and at least one back plate. The MEMS die is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. Sensors are deployed in various types of devices such as personal computers, cellular phones, mobile devices, headsets, and hearing aid devices.

SUMMARY

In an aspect of the disclosure, a sensor includes a substrate having a first surface and an opposing second surface, the second surface defining an indented region having an indented surface, the substrate defining a bottom port extending between the first surface and the indented surface. The sensor further includes a microelectromechanical system (MEMS) transducer mounted on the first surface of the substrate over the bottom port. The sensor also includes a filtering material disposed on the indented surface and positioned to cover the bottom port, the filtering material structured to prevent ingress of contaminants through the bottom port. The sensor further includes a cover disposed over the first surface of the substrate, the cover defining a back volume enclosing the MEMS transducer and the IC.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 2 shows a cross-sectional view of a portion of the first example sensor device shown in FIG. 1.

FIG. 3 shows a cross-sectional view of a portion of another sensor device that incorporates a mesh within the sensor package.

Figure 1:
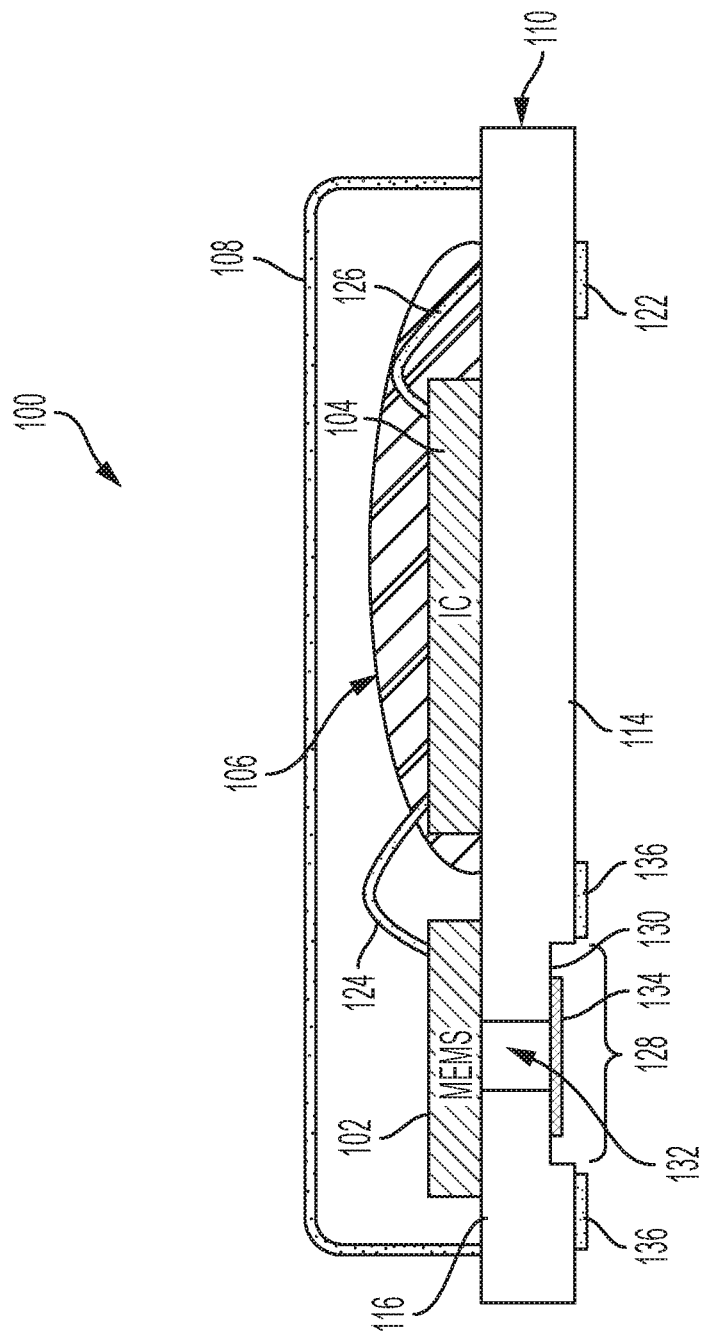
FIG. 1 shows a cross-sectional view of first example sensor device according to an embodiment of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for improving the robustness of sensor devices, such as those incorporating microelectromechanical systems (MEMS) transducers. In particular, the devices and techniques described in the present disclosure improve the resistance of a sensor package to ingression of contaminants, such as, for example, solid particles and liquids. In some implementations, the present disclosure may provide for improved resistance to contaminant ingression with little or no impact to the signal-to-noise ratio (SNR) of the sensor device.

In one or more embodiments, the sensor package can include a substrate with a bottom port through which sound energy can enter the sensor package and be incident on a MEMS transducer. The bottom port can be covered with a filtering structure or material that is acoustically permeable, but obstructs the passage of contaminants from entering the sensor package. In some such embodiments, the filtering material is a mesh material. In some implementations, the mesh can be disposed on an external or outer surface of the sensor package. For example, the mesh can be disposed within an indented region of an external or outer surface of the sensor package, which allows the mesh to have a relatively large surface area and thereby have a low acoustic impedance. As acoustic impedance can affect the SNR of the sensor device, the low acoustic impedance of the mesh may have substantially no impact on the SNR of the sensor device. The structures disclosed herein can be used to implement sensor devices such as audio sensor devices or microphone devices. The structures disclosed herein can also be used in related sensors, such as pressure sensors, sensors designed to detect non-audible frequencies such as ultrasonic, and multi-functional sensors that include the ability to detect pressure, gas, humidity or temperature.

In some embodiments, the bottom port is defined in a substrate of the sensor device. The substrate can include an indented region on a back surface of the substrate and around the bottom port. The mesh can be disposed within the indented region to cover the bottom port. The indented region can have a depth that is greater than a thickness of the mesh. In some embodiments, the indented region can have a depth that is substantially the same as a thickness of the mesh, such that a surface of the mesh is approximately flush with the surface of the substrate. In some embodiments, the sensor device can include a ground ring on the back surface of the substrate that surrounds the indented region and the bottom port.

In an aspect of the disclosure a sensor includes a substrate having a first surface and an opposing second surface, the second surface defining an indented region having an indented surface, the substrate defining a bottom port extending between the first surface and the indented surface. The sensor further includes a microelectromechanical system (MEMS) transducer mounted on the first surface of the substrate over the bottom port. The sensor also includes a filtering material disposed on the indented surface covering the bottom port, the filtering material structured to prevent ingress of particles through the bottom port. The sensor additionally includes an integrated circuit (IC) mounted on the first surface of the substrate, and a cover disposed over the first surface of the substrate, the cover defining a back volume enclosing the MEMS transducer and the IC FIG. 1 shows a cross-sectional view of first example sensor device 100 according to an embodiment of the present disclosure. The first example sensor device 100 includes a substrate 110, a microelectromechanical systems (MEMS) transducer 102, an integrated circuit (IC) 104, and a cover 108. The substrate 110 includes a first surface ("front surface") 116 and an opposing second surface ("back surface") 114. The MEMS transducer 102 and the IC 104 are disposed on the front surface 116 of the substrate 110. A first set of wires 124 electrically connect the MEMS transducer 102 to the IC 104, and a second set of wires 126 connect the IC 104 to interconnects (not shown) on the front surface 116 of the substrate 110. The MEMS transducer 102, the IC 104, and the substrate 110 can each include conductive bounding pads to which ends of the wires can be bonded. In some embodiments, wires 124 can be bonded to the appropriate bonding pads using a solder. Optionally, in some embodiments an encapsulating material 106 can at least partially (or in some instances completely) cover the IC 104 and the second set of wires 126. By covering the IC 104 and the second set of wires 126 within the encapsulating material 106, an effect of radio frequency signals, generated by the IC 104 and the second set of wires 125, on the MEMS transducer 102 and other components mounted on the substrate 110 can be reduced. The cover 108 encloses the MEMS transducer 102, the IC 104, the first set of wires 124, and the second set of wires 125, and defines a back volume of the sensor device 100. In some implementations, at least a portion of the IC 104 can be embedded into the substrate 110. For example, the front surface 116 of the substrate 110 can include a cavity, and the IC 104 can be disposed within the cavity. In some implementations, the cavity can be deeper than a height of the IC 104, such that a top surface of the IC 104 lies below the plane of the front surface 116. In some other implementations, the depth of the cavity can be such that the top surface of the IC 104 lies above the plane of the front surface 116 of the substrate 110.

The substrate 110 can include, without limitation, a printed circuit board, a semiconductor substrate, or a combination thereof. The substrate 110 can define an indented region 128 on the back surface 114 of the substrate 110. The indented region 128 can include an indented surface 130 that is offset from the back surface 114, such that a distance between the indented surface 130 and the front surface 116 is less than a distance between the back surface 114 and the front surface 116. The substrate 110 also defines a bottom port 132 that extends between the indented surface 130 and the front surface 116. The bottom port 132 is positioned below the MEMS transducer 102 and provides an acoustic channel between the MEMS transducer 102 and the outside of the sensor device 100. The bottom port 132 can have a circular, elliptical, or a polygonal (regular or irregular) shape in a plane that is parallel to the front surface 116.

An opening of the bottom port 132 on the indented surface 130 can be covered with a filtering material, such as, for example, a mesh filter 134. The mesh 134 can be acoustically permeable. That is, the mesh 134 can allow sound energy from outside of the sensor device 100 to enter the bottom port 132 and be incident on the MEMS transducer 102. The acoustic permeability of the mesh 134 can be high, such that the presence of the mesh 134 does not substantially affect the SNR of the sensor device 100. In some implementations, the acoustic permeability of the mesh 134 can be selected such that the SNR of the sensor 100 with the mesh 134 is no less than about 90% of the SNR of the sensor 100 without the mesh 134. Stated another way, the SNR of the sensor 100 with the mesh 134 is substantially similar to the SNR of the sensor 100 without the mesh 134. The mesh 134 can include a porous material that allows sound to pass through, but prevents contaminants, such as solid particles and liquids, from entering through the bottom port 132. The solid particles, can include, for example, dust particles and solder flux particles. In some implementations, the mesh 134 can include a metal screen with small openings. In some implementations, the mesh 134 can be configured to provide ingress protection to an extent that is equal to or exceeds the International Electrotechnical Commission (IEC) IP67 rating.

In some implementations, the mesh 134 can be formed of a netting, network, or interlace of a material, which can include, without limitation, a metal, a polymer (such as, for example, a polyamide), a composite, or a combination thereof. In some implementations, the mesh 134 can include openings that can range from about 1 micron to about 7 microns in size. In some implementations, the material used to form the mesh 134 can have hydrophobic properties, to prevent liquids from entering through the bottom port 132. For example, the mesh 134 can include Teflon, or Teflon-like materials to impart hydrophobic properties. In some implementations, a porous membrane can be utilized instead of, or in addition to, the mesh 134, where the membrane can have pores with sizes that are similar to those discussed above in relation to the mesh 134. In addition, the membrane can be made of materials similar to those discussed above in relation to the mesh 134.

In some implementations, the mesh 134 can be removably disposed over the bottom port 132. For example, the mesh 134 can be bonded to the indented surface 130 with an adhesive, such that the adhesive holds the mesh 134 in place over the bottom port 132, but can also allow the mesh 134 to be pulled and removed from over the bottom port 132 when sufficient force is applied. In some implementations, an epoxy can be used to bond the mesh 134 to the indented surface 130. In some other implementations, a die-attach can be used to bond the mesh 134 to the indented surface 130, such that the mesh 134 can be removed. In some implementations, a double sided adhesive film or tape can be used to bond the mesh 134 to the indented surface 130. The mesh 134 can be placed on the indented surface 130 using a pick-and-place system or a bonder. The adhesive can be applied to the indented surface 130, to the mesh 134 or both the indented surface 130 and the mesh 134 before the mesh 134 is placed on the indented surface 130. The mesh 134 can be removable and replaceable, such that once removed the mesh 134 can be replaced with another mesh or filtering material.

In some implementations, the mesh 134 can be disposed completely within the indented region 128. That is, a depth of the indented region 128, measured as a distance between the back surface 114 and the indented surface 130, can be equal to or greater than a thickness of the mesh 134. In some implementations, the depth of the indented region 128 can be greater than a distance between a surface of the mesh 134 facing the back surface 114 and the indented surface 130. Disposing the mesh 134 completely within the indented region 128 can protect the mesh 134 from damage. In some other implementations, the mesh 134 may be partially disposed within the indented region 128. In some such implementations, the depth of the indented region 128 can be less than a thickness of the mesh 134. Alternatively, the depth of the indented region 128 can be less than the distance between a surface of the mesh 134 facing the back surface 114 and the indented surface 130. In still further implementations, the depth of the indented region 128 can be substantially equal to the thickness of the mesh 134, such that the back surface 114 and a surface of the mesh 134 are substantially coplanar or flush with one another.

The sensor device 100 can include a first ground ring 136 disposed on the back surface 114 of the substrate 110. In some implementations, the first ground ring 136 can completely surround the indented region 128. In some other implementations, the first ground ring 136 may partially surround the indented region 128. In some implementations, the first ground ring 136 can be continuous. Alternatively, the first ground ring 136 can be discontinuous. The first ground ring 136 can include a conductive material such as copper, aluminum, silver, gold, or other conductive materials. In some implementations, the first ground ring 136 can be electrically coupled to a ground terminal of the sensor device 100.

As discussed above, the mesh 134 and the bottom port 132 allow sound energy to be incident on the MEMS transducer 102. The MEMS transducer 102 can include a diaphragm and a back plate that are disposed in a spaced-apart relationship. Both the diaphragm and the back plate can include conductive materials such that the combination of the diaphragm and the back plate form a variable capacitor, the capacitance of which is based in part on the distance between the diaphragm and the back plate. Acoustic energy incident on the diaphragm can cause the displacement of the diaphragm in relation to the back plate, causing a change in the capacitance of the variable capacitor. The change in the capacitance can be a function of the frequency and the magnitude of the incident acoustic energy. The MEMS transducer 102 can convert this change in capacitance in to an electrical signal. The electrical signal can be provided to the IC 104, which processes the electrical signal to generate a sensor signal. The IC 104 can include analog and digital circuity for carrying out processing such as, without limitation, amplification, filtering, analog-to-digital conversion, digital-to-digital conversion, and level shifting.

In some implementations, the sensor device 100 can be utilized as a microphone device, where the sensor 100 generates electrical signals corresponding to incident audible sound signals. In some implementations, the sensor 100 also can be utilized as a pressure sensor, where the sensor 100 generates electrical signals responsive to pressure changes. In some implementations, the sensor 100 also can be utilized as an acoustic sensor, where the acoustic sensor 100 generates electrical signals responsive to incident acoustic energy of any level and any frequency ranges, such as ultrasonic, subsonic, etc.

FIG. 2 shows a cross-sectional view of a portion of the first example sensor device 100 shown in FIG. 1. In particular, FIG. 2 shows the MEMS transducer 102 disposed on the front surface 116 of the substrate 110, and the mesh 134 disposed on the indented surface 130 and covering the bottom port 132. The MEMS transducer 102 is coupled to the front surface 116 with a die attach 140. The die attach 140 can include an adhesive, a solder, an epoxy, or some other material that can bond the MEMS transducer 102 to the front surface 116. The mesh 134 is bonded to the indented surface 130 with a bonding material 142, which can include a die attach, a solder, an adhesive, an epoxy, or some other material that can bond the mesh 134 to the indented surface 130. The placement of the mesh 134 within a recess 128 on a back surface 114 of the substrate 110 of the sensor device 100, as opposed to between the substrate 110 and the MEMS transducer 102, can improve the acoustic permittivity of the mesh 134. The improvement in the acoustic permittivity can be a result, in part, of a larger effective surface area of the mesh 134 and, in part, on a larger cross-sectional area of the bottom port, in comparison to those associated in an arrangement where the mesh is positioned between the MEMS transducer and the substrate. The effective surface area can refer to an area of a portion of the mesh 134 that is exposed and allows flow of acoustic energy therethrough. For example, $Wm1$ indicates a width of the area of the portion of the mesh 134 that is exposed, i.e., not covered by the bonding material 142, and allows the flow of acoustic energy. Also, $Wp1$ indicates a width of the bottom port 132. In some implementations, the width $Wm1$ of the effective area of the mesh 134 is greater than the width $Wp1$ of the bottom port 132. In some implementations, the effective surface area of the mesh 134 can be greater than the cross-sectional area of the bottom port 132.

In some implementations, the cross-sectional area (within a plane parallel to the front surface 116 or the indented surface 130) of the bottom port 132 can have any shape including, without limitation, circular, elliptical, and polygonal (regular or irregular). In some implementations, a dimension of the cross-sectional area of the bottom port 132 can be about 325 microns to about 1100 microns. The dimension can include, without limitation, a diameter, a major axis, a longitudinal axis, and a diagonal. In some implementations, the substrate 110 can define more than one bottom port or opening. For example, the substrate 110 can define two bottom ports or openings extending between the front surface 116 and the indented surface 130 and positioned below the MEMS transducer 102. The cross-sectional areas of each of the more than one bottom port or opening can be equal or unequal, and can have any of the cross-sectional area shapes discussed above in relation to the bottom port 134. In some implementations, the surface area of the of a portion of the mesh 134 that allows flow of acoustic energy therethrough is greater than a cross-sectional area of the bottom port 134.

FIG. 3 shows a cross-sectional view of a portion of a traditional sensor device 300 that incorporates a mesh disposed between the substrate and the MEMS die, and is reproduced here to help illustrate the features and benefits of the example sensor device 100 shown in FIG. 2. In particular, the sensor device 300 includes a substrate 310, a MEMS transducer 302, and a mesh 334. The substrate 310 defines a bottom port 332 that extends between a front surface 316 and a back surface 314 of the substrate 310. The mesh 334 is disposed on the front surface 316 by a bonding material 342. The MEMS transducer 302 is disposed on the mesh 334 by a bonding material 340. A width of the MEMS transducer 302 is typically fixed. During manufacturing sensor device 300 shown in FIG. 3, an opening in each layer below the MEMS transducer 302 has a reduced width to provide adequate structural support to the layers above. For example, the width of the opening in the bonding material 342, between the mesh 334 and the substrate 310, is smaller than the width of the opening in the bonding material 340 between the MEMS transducer 302 and the mesh 334. Further, a width Wp2 of the bottom port 332 in the substrate 310 is smaller than the width of the opening in the bonding material 342 to provide adequate structural support to the bonding material 342. Thus, the width Wp2 of the bottom port 332 is limited by the number of layers between the substrate 310 and the MEMS transducer 302. In addition, a width Wm2 of the effective area of the mesh 334 is limited by the width of the opening in the bonding material 342.

In contrast, referring to FIG. 2, only the die attach layer 140 is disposed between the MEMS transducer 102 and the substrate 110. Thus, the width Wp1 of the bottom port 132 is relatively larger than the width Wp2 of the bottom port 332 shown in FIG. 3. In some implementations, the width Wp1 can be about 0.325 mm to about 1.1 mm, and the width Wp2 can be about 0.25 mm to about 0.65 mm. In addition, as the mesh 134 in FIG. 2 is disposed on the indented surface 130, the opening in the bonding material 142 can be made as large as possible while providing adequate support to the mesh 134. The resulting effective area, the width Wm1 of which is indicated in FIG. 2, is substantially larger than that (Wm2) of the mesh 334 shown in FIG. 3. In some implementations, the width Wm1 can be about 0.3 mm to about 1.15 mm, and the width Wm2 can be about 0.65 mm to about 0.85 mm. Thus, by disposing the mesh 134 below the substrate 110, instead of between the MEMS transducer and the substrate, the width of the bottom port 132 and the effective area of the mesh 134 can be increased. Increasing the width of the bottom port and increasing the effective area of the mesh 134 can, in turn, improve the acoustic permittivity of the mesh 134 and the bottom port 132, thereby reducing the impact on the SNR of the sensor device 100.

In addition, disposing the mesh 134 within the recess 128 formed on the back surface 114 of the substrate 110, as shown in FIG. 2, reduces the complexity and cost of manufacturing the sensor device 100 as compared to that of the sensor device 300 shown in FIG. 3. As mentioned above, the layers in the sensor device 300 disposed below the MEMS transducer 302 have respective openings with gradually increasing widths starting from the substrate 310 to the bonding material 340. To achieve the widest possible bottom port 332, each layer may be deposited and patterned with high accuracy and precision. This desire for high accuracy and precision can increase the cost of manufacturing of the sensor device 300. On the other hand, the sensor device 100 shown in FIG. 2 has only one die attach 140 layer disposed between the substrate 110 and the MEMS transducer 102. This allows the manufacturing process to have relaxed accuracy and precision to achieve a bottom port 132 with the same or more width than the bottom port 332 shown in FIG. 3. Thus, the cost of manufacturing is also reduced.

Figure 5:
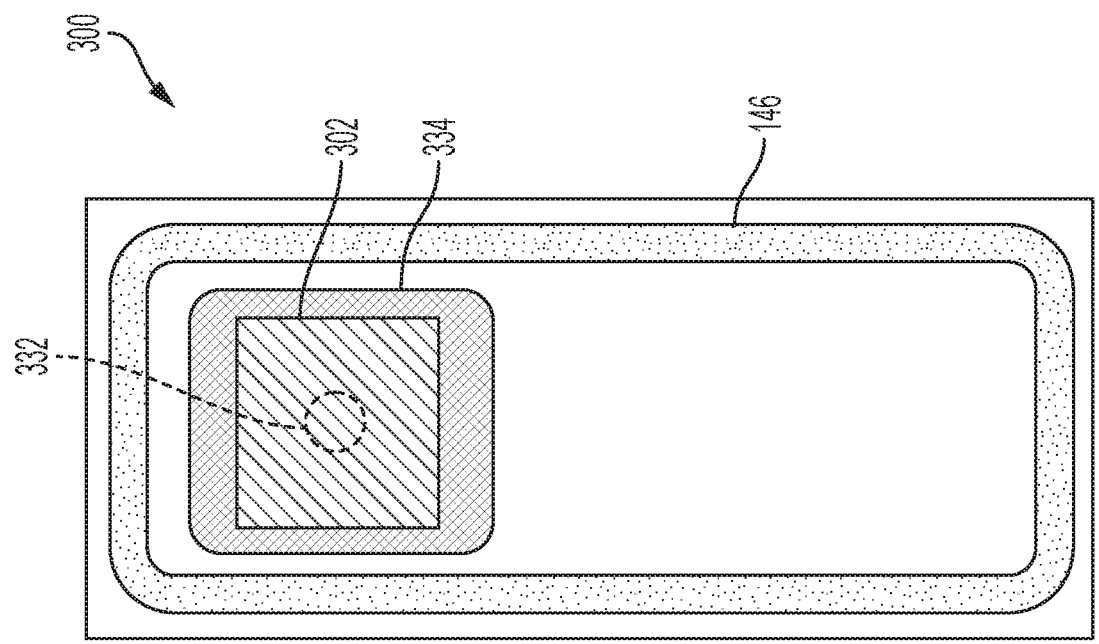
FIG. 5 shows a top view of the other sensor device, a portion of which is shown in FIG. 3.
Figure 4:
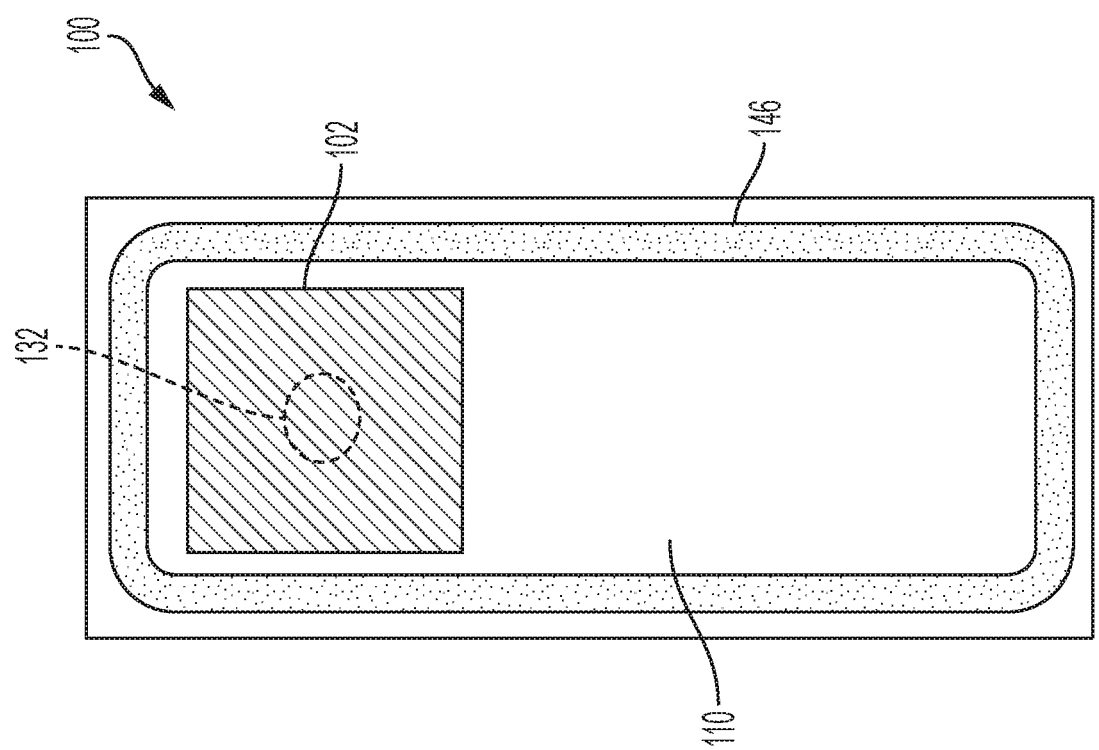
FIG. 4 shows a top view of the first example sensor device shown in FIGS. 1 and 2.

FIG. 4 shows a top view of the first example sensor device 100 shown in FIGS. 1 and 2. FIG. 5 shows a top view of a traditional sensor device, a portion of which is shown in FIG. 3. FIGS. 4 and 5 show top views of the sensors with their respective covers removed. In particular, the sensor device 100 shown in FIG. 4 includes a mesh (not shown), where the substrate 110 is disposed between the MEMS transducer 102 and the mesh. FIG. 5, in contrast, has the mesh 334 disposed between the MEMS transducer 302 and the substrate 310. In FIG. 4, the width of the bottom port 132 is relatively larger than that of the bottom port 332 shown in FIG. 5. In addition, the sensor device 100 shown in FIG. 4 includes a second ground ring 146 that can be used for bonding the cover 108 to the substrate 110. The placement of the mesh on the back surface of the substrate 110 in FIG. 4 provides additional area that can be used to accommodate a larger MEMS transducer 102, or a larger bottom port 132, compared to the MEMS transducer 302 and the bottom port 332, respectively, of the sensor device 300 shown in FIG. 5.

Figure 6:
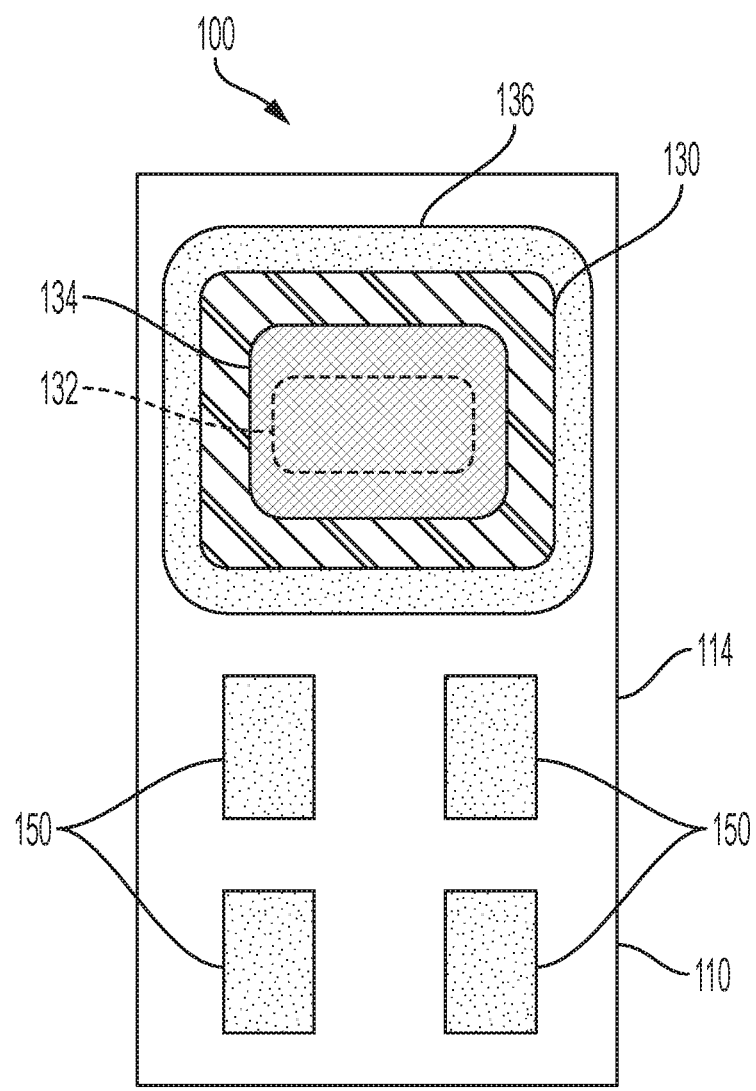
FIG. 6 shows a bottom view of the first example sensor device shown in FIG. 1.

FIG. 6 shows a bottom view of the first example sensor device 100 shown in FIG. 1. The sensor device 100 includes the first ground ring 136 surrounding the mesh 134 and the bottom port 132. The first ground ring 136 can be disposed over the back surface 114 of the substrate 110 (also as shown in FIG. 1). While FIG. 6 shows the first ground ring 136 completely surrounding the mesh 134 and the bottom port 132 within the indented region 128, in some embodiments, the first ground ring may only partially surround the mesh 134 and the bottom port 132. The first ground ring 136 can provide a surface to couple with a port or channel of an end device in which the sensor device 100 is installed. For example, the sensor device 100 can be installed in a phone. The first ground ring 136 can be shaped to match a shape of a port or channel of the phone housing that directs acoustic signals from outside of the phone package into the sensor device 100. The first ground ring 136 can provide a bonding surface on which the port or channel of the phone housing can be bonded. In some implementations, the first ground ring 136 can include a conductive material such as, for example, copper, aluminum, silver and gold. In some implementations, a perimeter of the first ground ring 136 can have a shape that is similar to the shape of the bottom port 132. For example, as shown in FIG. 6, both the perimeter of the first ground ring 136 and the perimeter of bottom port 132 are rectangular. Alternatively, the shape of the perimeter of the ground ring 136 can be different from the shape of the perimeter of the bottom port. For example, the shape of the perimeter of the first ground ring 136 can be rectangular, while that of the bottom port 132 can be circular. In some implementations, the shape of the perimeter of the first ground ring 136 can be circular, elliptical, rectangular, square, or polygonal (regular or irregular).

The sensor device 100 also includes electrical contacts 150 disposed on the back surface 114. The electrical contacts 150 allow electrical connectivity to one or more terminals of the sensor device 100. For example, the electrical contacts 150 can represent terminals such as, without limitation, a clock input terminal, a data output terminal, a left/right selection input terminal, and a power supply terminal. When installed in an application, the electrical contacts 150 can be electrically connected to other electronic circuitry in the application.

Figure 7:
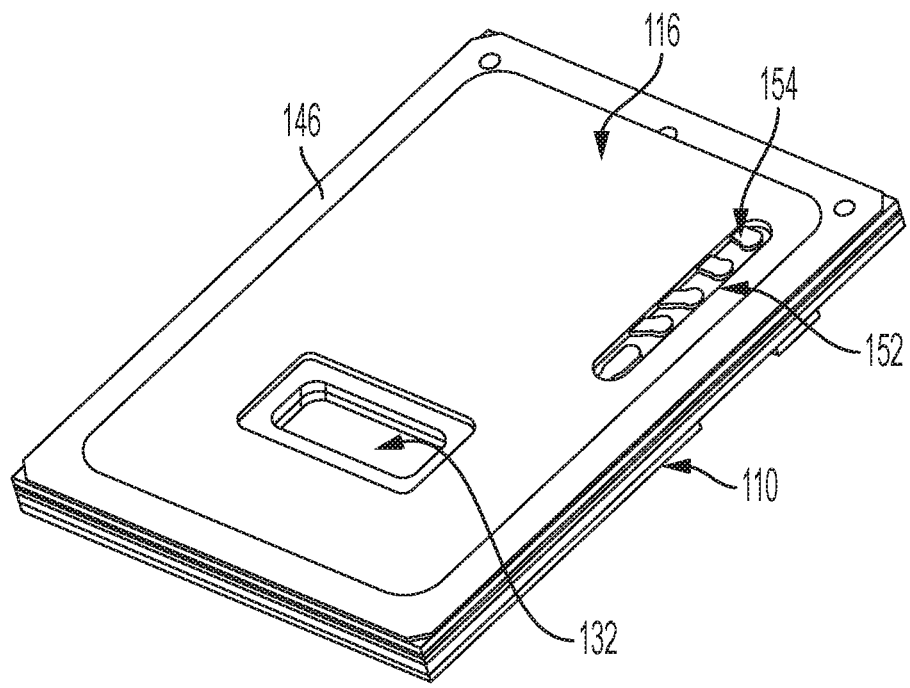
FIGS. 7 and 8 show isometric views of a front surface and a back surface, respectively, of a substrate of the first sensor device shown in FIG. 1.
Figure 8:
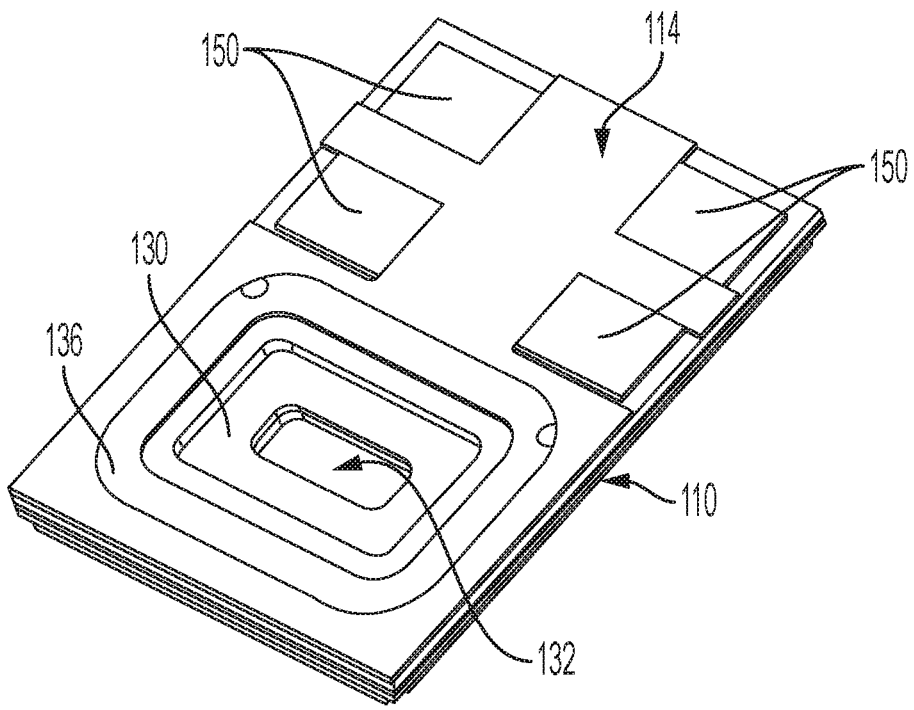

FIGS. 7 and 8 show isometric views of a front surface and a back surface, respectively, of a substrate of the first sensor device 100 shown in FIG. 1. FIG. 7 shows a bottom port 132 formed in the substrate 110. While not shown, a MEMS transducer, such as the MEMS transducer 102 shown in FIG.

1, can be disposed on the front surface 116 over the bottom port 132. The substrate 110 can be a multi-layer printed circuit board, where one or more layers can include interconnects for carrying electrical signals. The front surface 116 can define an opening 152 exposing underlying interconnects 154. During the manufacturing process, one or more bonding wires can be connected between the interconnects 154 and an IC or a MEMS transducer disposed on the front surface 116. The substrate 110 also includes the second ground ring 146 to which a cover, such as the cover 108 shown in FIG. 1, can be bonded.

FIG. 8 shows the back surface 114 of the substrate 110. The substrate 110 includes the indented region having an indented surface 130. The bottom port 132 extends between the indented surface 130 and the front surface 116 (shown in FIG. 7). While not shown in FIG. 8, a mesh, such as the mesh 134 shown in FIG. 1, can be disposed on the indented surface 130 covering the bottom port 132. The substrate 110 includes the first ground ring 136 that surrounds the indented region and the bottom port 132. The substrate 110 additionally includes four electrical contacts 150 that provide connectivity to one or more interconnects in the substrate 110.

Figure 9:
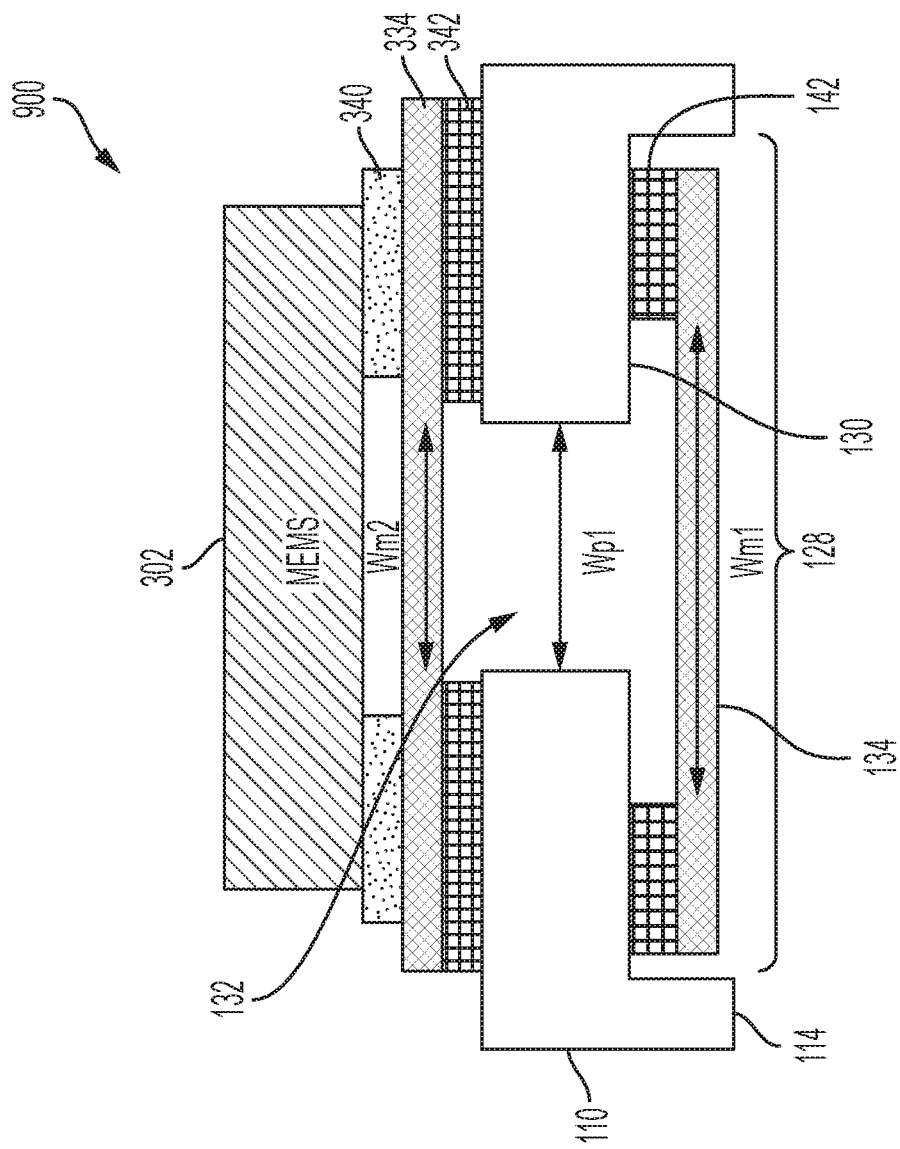
FIG. 9 shows a cross-sectional view of a portion of yet another sensor device that incorporates more than one mesh within the sensor package.

FIG. 9 shows a cross-sectional view of a portion of another sensor device 900 that incorporates more than one mesh. In particular, the sensor device 900 shown in FIG. 9 incorporates a first mesh disposed between the substrate and the MEMS transducer and a second mesh disposed on an indented surface of the substrate and covering the bottom port. For example, FIG. 9 shows that the first mesh 334 is disposed between the front surface 316 of the substrate 310 and the MEMS transducer 302, and a second mesh 134 bonded to the indented surface 130 and covering the bottom port 132. The first mesh 334 can be similar to the mesh 334 discussed above in relation to FIG. 3, and the second mesh 134 can be similar to the mesh 134 discussed above in relation to FIG. 2. For example, the first mesh 334 can have a width Wm2 of an effective area similar to the width Wm2 of the effective area of the mesh 334 shown in FIG. 3. The width Wm1 of an effective area of the second mesh 134 can be similar to the width Wm1 of the effective area of the mesh 134 shown in FIG. 2. The combination of the first mesh 334 and the second mesh 134 provides additional ingress protection to the MEMS transducer 302. For example, the ingress protection provided by the sensor device 900 can be greater than the ingress protection provided by the sensor device 200 or the sensor device 300 alone.

Each of the sensor devices discussed above can provide a degree of ingress protection that meets the ISO 22810 standard. In some examples, the sensor devices can provide water ingress protection up to 3 atmosphere pressure (or at a depth of 30 meters) or up to 5 atmosphere pressure (or a depth of 50 meters).

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) assembly comprising:
    a substrate having a first surface and an opposing second surface, the second surface defining an indented region having an indented surface, the substrate defining a port extending between the first surface and the indented surface;
    a filtering material disposed on the indented surface and positioned to cover the port; and
    a microelectromechanical system (MEMS) transducer disposed over the first surface and over the port, wherein the MEMS transducer is coupled to the first surface;
    wherein a surface area of a portion of the filtering material that allows flow of acoustic energy therethrough is greater than a cross-sectional area of the port.

2. The assembly of claim 1, wherein a distance between the indented surface and the first surface is less than a distance between the second surface and the first surface.

3. The assembly of claim 1, wherein a depth of the indented region is greater than a thickness of the filtering material.

4. The assembly of claim 1, wherein a depth of the indented region is substantially equal to a thickness of the filtering material.

5. The assembly of claim 1, further comprising a first ground ring disposed on the second surface and surrounding the indented region.

6. The assembly of claim 5, wherein a perimeter of the first ground ring is rectangular or square shaped.

7. The assembly of claim 1, further comprising a second ground ring disposed on the first surface, wherein at least a portion of a cover is bonded with the second ground ring.

8. The assembly of claim 1, further comprising at least one electrical contact disposed on the second surface.

9. The assembly of claim 1, wherein the filtering material includes a mesh filter.

10. The assembly of claim 9, wherein the mesh filter includes an interlaced network of at least one of a metal, a polymer, or a composite.

11. The assembly of claim 1, wherein the filtering material includes a porous membrane.

12. The assembly of claim 1, wherein the filtering material is removably disposed on the indented surface.

13. The assembly of claim 1, wherein the filtering material includes a replaceable mesh filter.

14. The assembly of claim 1, wherein a bonding material is disposed between the filtering material and the indented surface, the bonding material including at least one of an adhesive, a die attach, and an epoxy.

15. The assembly of claim 1, further comprising an integrated circuit mounted on the first surface of the substrate.

16. The assembly of claim 15, wherein at least a portion of the integrated circuit is embedded into the substrate.

17. The assembly of claim 1, wherein at least one dimension of a cross-sectional area of the port is about 325 microns to about 1100 microns.

18. The assembly of claim 1, wherein the filtering material is a first filtering material, and the assembly further comprises a second filtering material disposed between the first surface and the MEMS device.

* * * * *